United States Patent
Ko et al.

(10) Patent No.: US 9,538,640 B2
(45) Date of Patent: Jan. 3, 2017

(54) CONDUCTIVE SUBSTRATE AND TOUCH DISPLAY DEVICE

(71) Applicant: Innolux Corporation, Miao-Li County (TW)

(72) Inventors: Wen-Po Ko, Miao-Li County (TW); Chieh-Wen Lin, Miao-Li County (TW); Chung-I Lin, Miao-Li County (TW); Kuan-Chih Chen, Miao-Li County (TW); Jeng-Feng Shih, Miao-Li County (TW); Tzu-I Tsao, Miao-Li County (TW); Chien-Hung Lin, Miao-Li County (TW); Cheng-Min Wu, Miao-Li County (TW); Yu Lo, Miao-Li County (TW); Min-Hsiang Lo, Miao-Li County (TW); Kun-Yi Lin, Miao-Li County (TW); Yi-Chun Liu, Miao-Li County (TW); Ming-Jhih Chen, Miao-Li County (TW); Cheng-Chen Yang, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 0 days.

(21) Appl. No.: 14/015,639

(22) Filed: Aug. 30, 2013

(65) Prior Publication Data

US 2014/0063370 A1 Mar. 6, 2014

(30) Foreign Application Priority Data

Aug. 31, 2012 (TW) ............................. 101131858 A
Jun. 28, 2013 (TW) ............................. 102123331 A

(51) Int. Cl.
*G02F 1/1335* (2006.01)
*H05K 1/02* (2006.01)
(Continued)

(52) U.S. Cl.
CPC ......... *H05K 1/0274* (2013.01); *G02F 1/13338* (2013.01); *G02F 1/133305* (2013.01);
(Continued)

(58) Field of Classification Search
CPC ............ G02F 1/13338; G02F 1/133305; G02F 1/133502; G02F 1/134363; G02F 2201/121; G02F 3/044; G02F 2203/04103; H05K 1/0274; H05K 1/0287
(Continued)

(56) References Cited

U.S. PATENT DOCUMENTS

2006/0097991 A1   5/2006  Hotelling et al.
2008/0211395 A1*  9/2008  Koshihara ............... G06F 3/044
                                              313/504
(Continued)

FOREIGN PATENT DOCUMENTS

CN   101901073 A   12/2010
CN   102016762 A   4/2011
(Continued)

*Primary Examiner* — Charles Chang
(74) *Attorney, Agent, or Firm* — Muncy, Geissler, Olds & Lowe, P.C.

(57) ABSTRACT

A conductive substrate comprises a substrate, a plurality of conductive patterns, and a plurality of optical compensation patterns. The conductive patterns extend along a first direction and are sequentially disposed on the substrate along a second direction. The optical compensation patterns are staggered from the conductive patterns along the second direction on the substrate. An edge of at least one of the conductive patterns extending along the first direction has a plurality of conductive protrusions, and an edge of at least one of the optical compensation patterns extending along the first direction has a plurality of optical compensation protrusions. A touch display device is also disclosed.

14 Claims, 15 Drawing Sheets

(51) Int. Cl.
  *G02F 1/1333* (2006.01)
  *G02F 1/1343* (2006.01)
  *G06F 3/044* (2006.01)
(52) U.S. Cl.
  CPC .. *G02F 1/133502* (2013.01); *G02F 1/134363* (2013.01); *G06F 3/044* (2013.01); *G02F 2201/121* (2013.01); *G06F 2203/04103* (2013.01); *H05K 1/0287* (2013.01)
(58) Field of Classification Search
  USPC .......................................................... 349/12
  See application file for complete search history.

(56) References Cited

U.S. PATENT DOCUMENTS

| | | |
|---|---|---|
| 2009/0267916 A1 | 10/2009 | Hotelling |
| 2009/0273577 A1 | 11/2009 | Chen et al. |
| 2010/0026662 A1* | 2/2010 | Oohira ................ G02F 1/13338 345/174 |
| 2010/0110038 A1* | 5/2010 | Mo et al. ...................... 345/174 |
| 2010/0144391 A1 | 6/2010 | Chang et al. |
| 2010/0201633 A1 | 8/2010 | Mozdzyn et al. |
| 2012/0062511 A1* | 3/2012 | Ishizaki .................. G06F 3/044 345/174 |
| 2013/0057493 A1* | 3/2013 | Hwang ................ G06F 3/0418 345/173 |
| 2013/0207924 A1* | 8/2013 | Mohindra ............... G06F 3/044 345/174 |

FOREIGN PATENT DOCUMENTS

| | | |
|---|---|---|
| CN | 103649881 A | 3/2014 |
| TW | 200643778 A | 12/2006 |
| TW | 200705247 A | 2/2007 |
| TW | 201100907 A | 1/2011 |

* cited by examiner ial application claims priority under 35
CONDUCTIVE SUBSTRATE AND TOUCH DISPLAY DEVICE

CROSS REFERENCE TO RELATED APPLICATIONS

This Non-provisional application claims priority under 35 U.S.C. §119(a) on Patent Application No(s). 101131858 and 102123331 filed in Taiwan, Republic of China on Aug. 31, 2012 and Jun. 28, 2013, the entire contents of which are hereby incorporated by reference.

BACKGROUND

Technical Field

The disclosed embodiments relate to a conductive substrate and a touch display device.

Related Art

With the progress of technologies, a touch input function has been widely applied to various electronic products. For a display device capable of the touch function, a user can conduct many functions by directly touching or clicking the screen thereof so that the user's operation can be simplified a lot.

According to the structure type, the touch display device can be divided into an out cell type and an in cell type. For the out cell type, a substrate with a touch function is added to a display panel so that the whole structure has at least three substrates. For the in cell type, it can be further divided into two kinds, in one of which the touch conductive patterns are embedded in the liquid crystal (LC) pixels, and in the other the touch conductive patterns are embedded between the color filter (CF) substrate and the polarizer. The latter kind is also called the on cell type. For the in cell type, the touch function is integrated into the display panel so that the whole structure just has two substrates, i.e. the two substrates of the display panel. Because the product of the in cell type can be made thinner and lighter, and can be made by less processes (e.g. the alignment process is omitted) and the less cost, the touch display device of the in cell type will become the mainstream product in the future.

FIG. 1 is a schematic diagram of a conventional touch display device 1 of the on cell type. The touch display device 1 includes a first substrate 11, a second substrate 12, a liquid crystal layer 13, and a signal processing module 14. The first substrate 11 has a plurality of first conductive patterns 111 which are sequentially disposed on the first substrate 11. The second substrate 12 is disposed opposite to the first substrate 11, and has a plurality of second conductive patterns 121 which are sequentially disposed on the second substrate 12. The first and second conductive patterns 111 and 121 all function as electrodes. The liquid crystal layer 13 is disposed between the first and second substrates 11 and 12. The first conductive patterns 111 and the second conductive patterns 121 are electrically connected to the signal processing module 14 through conductive wires, respectively, for transmitting the signal about capacitance variation caused by the user's touch or click. The signal processing module 14 generates a coordinate signal representing the touch input by processing the signals from the conductive wires.

However, because the first conductive patterns 111 are disposed apart on the first substrate 11, different transmittances are caused by the thickness difference and refractive index difference between the portion with the first conductive patterns, and the portion without the first conductive patterns, and the edge scattering effect. Besides, because each of the first conductive patterns 111 is disposed on the first substrate 11 in the form of a rectangle, moiré interference is easily caused by the first conductive patterns 111 and the pixel structures. Therefore, when the user views the touch display device 1, the edges of the first conductive patterns 111 are easily perceived by the human eyes, thereby affecting the display effectiveness of the touch display device 1.

Therefore, it is an important subject to provide a conductive substrate and a touch display device wherein the edges of the conductive patterns are blurred for enhancing the whole visual effect.

SUMMARY

In view of the foregoing subject, an objective of the invention is to provide a conductive substrate and a touch display device wherein the edges of the conductive patterns are blurred for enhancing the whole visual effect.

To achieve the above objective, a conductive substrate according to the embodiments of the invention includes a substrate, a plurality of conductive patterns, and a plurality of optical compensation patterns. The conductive patterns extend along a first direction and are sequentially disposed on the substrate along a second direction. The optical compensation patterns are staggered from the conductive patterns along the second direction on the substrate. An edge of at least one of the conductive patterns extending along the first direction has a plurality of conductive protrusions, and an edge of at least one of the optical compensation patterns extending along the first direction has a plurality of optical compensation protrusions.

In one embodiment, the adjacent conductive protrusions and optical compensation protrusions are staggered from each other.

In one embodiment, the adjacent conductive protrusions and optical compensation protrusions are staggered from each other in the way of a zigzag or in the way of convexes and concaves.

In one embodiment, a width of at least one of the conductive patterns is between 300 microns and 1000 microns, and a width of at least one of the optical compensation patterns is between 500 microns and 2000 microns.

In one embodiment, an interval formed between the adjacent conductive pattern and optical compensation pattern is between 1 micron and 10 microns.

In one embodiment, the conductive substrate further comprises a signal processing unit electrically connected to the conductive patterns.

In one embodiment, the optical compensation patterns are a grounding electrode.

To achieve the above objective, a touch display device according to the embodiments of the invention includes a first conductive substrate, a substrate and a liquid crystal layer. The first conductive substrate includes a first substrate, a plurality of first conductive patterns and a plurality of optical compensation patterns. The first conductive patterns extend along a first direction and are sequentially disposed on the first substrate along a second direction. The optical compensation patterns are staggered from the first conductive patterns along the second direction on the first substrate. An edge of at least one of the first conductive patterns extending along the first direction has a plurality of conductive protrusions, and an edge of at least one of the optical compensation patterns extending along the first direction has a plurality of optical compensation protrusions. The substrate is disposed opposite the first conductive substrate. The liquid crystal layer is disposed between the first conductive substrate and the substrate.

In one embodiment, the substrate is a second conductive substrate including a second substrate and a plurality of second conductive patterns which extend along the second direction and are sequentially disposed on the second substrate along the first direction.

In one embodiment, the first conductive patterns are a plurality of transmitter electrodes and a plurality of receiver electrodes, respectively.

In one embodiment, the optical compensation patterns are surrounded by the transmitter electrodes.

In one embodiment, the adjacent conductive protrusions and optical compensation protrusions are staggered from each other.

In one embodiment, the adjacent conductive protrusions and optical compensation protrusions are staggered from each other in the way of a zigzag or in the way of convexes and concaves.

In one embodiment, a width of at least one of the first conductive patterns is between 300 microns and 1000 microns, and a width of at least one of the optical compensation patterns is between 500 microns and 2000 microns.

In one embodiment, an interval formed between the adjacent first conductive pattern and optical compensation pattern is between 1 micron and 10 microns.

In one embodiment, the touch display device further comprises a signal processing module, a first polarizing structure, a color filter layer, a second polarizing structure, and a backlight module. The signal processing module is electrically connected to the first conductive patterns and the second conductive patterns. The first polarizing structure is disposed on the first conductive substrate. The color filter layer is disposed between the first conductive substrate and the liquid crystal layer and has a blocking structure, and the vertical projection of the blocking structure covers at least a part of the optical compensation patterns. The second polarizing structure is disposed on a side of the second conductive substrate away from the liquid crystal layer. The backlight module is disposed on a side of the second polarizing structure away from the second conductive substrate.

In one embodiment, the first polarizing structure further comprises an adhesive film, a polarizing film, and a protective film. The adhesive film is disposed on the first conductive substrate. The polarizing film is disposed on the adhesive film. The protective film is disposed on the polarizing film. The first polarizing structure includes an anti-electrostatic material.

In one embodiment, the touch display device further comprises a frame. The frame has an accommodating space for accommodating the first conductive substrate, the second conductive substrate, the liquid crystal layer, the signal processing module, the first polarizing structure, the color filter layer, the second polarizing structure, and the backlight module.

As mentioned above, in a conductive substrate and a touch display device according to the embodiments of the invention, an edge of at least one of the conductive patterns extending along a first direction has a plurality of conductive protrusions, an edge of at least one of the optical compensation patterns extending along the first direction has a plurality of optical compensation protrusions, and the conductive patterns and the optical compensation patterns are staggered from each other. Thereby, the edges of the conductive patterns can be effectively blurred, and thus the whole visual effect can be enhanced.

BRIEF DESCRIPTION OF THE DRAWINGS

The invention will become more fully understood from the detailed description and accompanying drawings, which are given for illustration only, and thus are not limitative of the present invention, and wherein.

DETAILED DESCRIPTION

The present invention will be apparent from the following detailed description, which proceeds with reference to the accompanying drawings, wherein the same references relate to the same elements.

Figure 1:
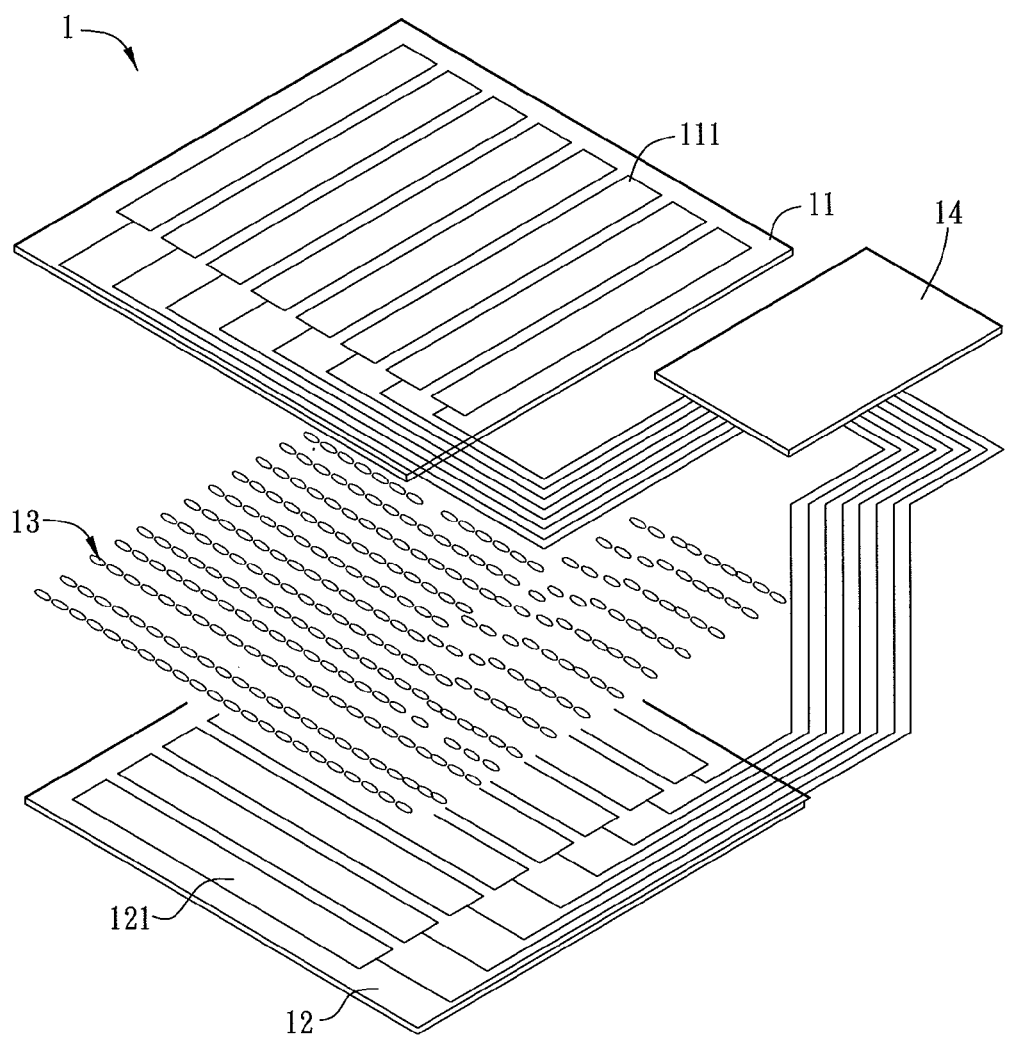
FIG. 1 is a schematic diagram of a conventional touch display device.
Figure 2:
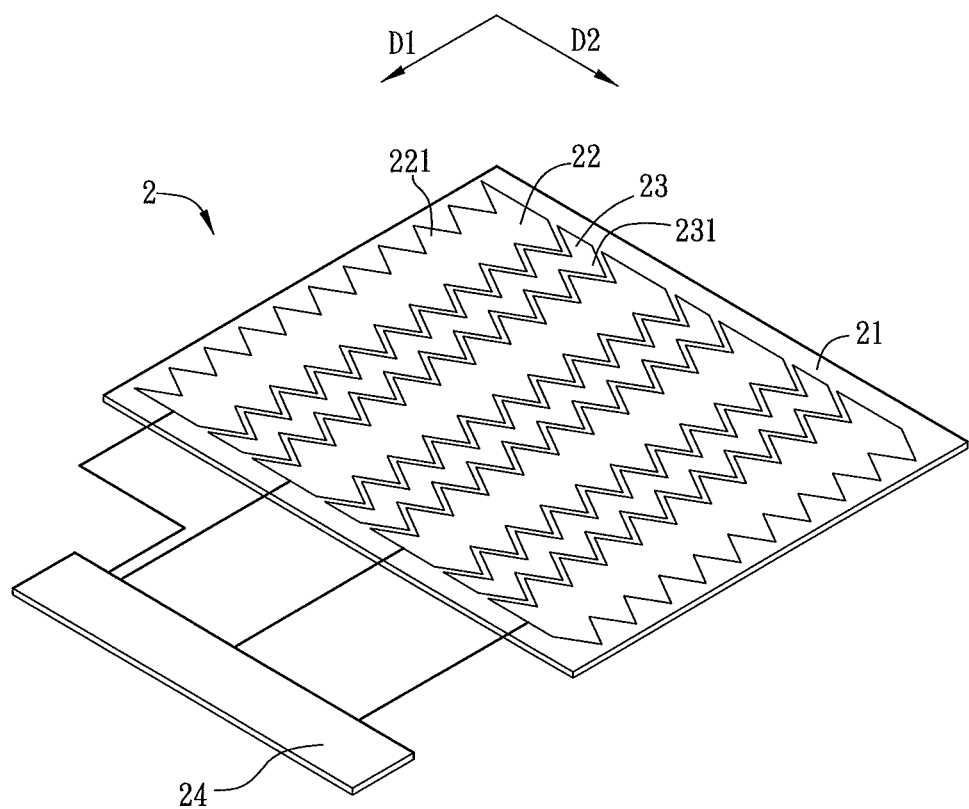
FIG. 2 is a schematic diagram of a conductive substrate according to an embodiment of the invention.

FIG. 2 is a schematic diagram of a conductive substrate 2 according to an embodiment of the invention. In FIG. 2, the conductive substrate 2 includes a substrate 21, a plurality of conductive patterns 22, and a plurality of optical compensation patterns 23.

The substrate 21 is a transparent substrate, such as a plastic substrate or a glass substrate. Otherwise, the substrate 21 can be a transparent film-like substrate, and made by polyimide (PI) or polyethylene terephthalate (PET) for example. As a film-like substrate, the substrate 21 is capable of flexibility. In other words, the substrate 21 of this embodiment can be an inflexible substrate or a flexible substrate.

The conductive patterns 22 extend along a first direction D1, and are disposed sequentially and apart on a surface of the substrate 21 along a second direction D2. Besides, the edge of the conductive pattern 22 extending along the first direction D1 has a plurality of conductive protrusions 221. In this embodiment, the first direction D1 is X-axis direction while the second direction D2 is Y-axis direction, for example. The conductive patterns 22 are made by transparent material, such as indium tin oxide (ITO) or indium zinc oxide (IZO). Each of the conductive patterns 22 has a width between 300 microns and 1000 microns.

The optical compensation patterns 23 are disposed on the substrate 21 along the second direction D2, staggered from the conductive patterns 22. Besides, the edge of each of the optical compensation patterns 23 extending along the first direction D1 has a plurality of optical compensation protrusions 231. As an embodiment, the materials of the optical compensation pattern 23 and conductive pattern 22 can be the same, such as transparent ITO or IZO, and a width of each of the optical compensation patterns 23 is between 500 microns and 2000 microns. Moreover, the optical compensation pattern 23 and the conductive pattern 22 are spaced at an interval, which is between 1 micron and 10 microns for example and preferably between 1 micron and 5 microns, i.e. the limit of the photolithography process.

In this embodiment, for the adjacent conductive pattern 22 and optical compensation pattern 23, the conductive protrusions 221 of the conductive pattern 22 and the optical compensation protrusions 231 of the optical compensation pattern 23 are staggered from each other, and that is, the top end of the conductive protrusion 221 is corresponding to the bottom end of the adjacent optical compensation protrusion 231 while the bottom end of the conductive protrusion 221 is corresponding to the top end of the adjacent optical compensation protrusion 231. By such staggered disposition, the interval therebetween can be kept constant.

To deserve to be mentioned, the appearances of the conductive protrusion 221 and optical compensation protrusion 231 are each like a triangle. Besides, the two adjacent conductive protrusion 221 and optical compensation protrusion 231 are staggered in the way of a zigzag. In other embodiments, the conductive protrusions 221 and the optical compensation protrusions 231 can be designed differently, and for example, each of them can have an appearance like a polygon or a circle.

Such staggered disposition of the adjacent conductive protrusions 221 and optical compensation protrusions 231 can interfere with (such as destroying) the light passing through the conductive patterns 22 and the optical compensation patterns 23, thereby reducing the refraction effect and the scattering effect and also blurring the edges of the conductive patterns 22 and optical compensation patterns 23, so as to lower down the influence of the edge notches on the visual effect. Therefore, the whole visual effect is enhanced.

As an embodiment, the conductive substrate 2 can further include a signal processing unit 24, which is electrically connected to the all conductive patterns 22 through conductive wires to receive the signals about capacitance variation generated by the conductive patterns 22. The signal processing unit 24 is disposed on a printed circuit board (PCB) or a flexible printed circuit (FPC) board for example. To be noted, the optical compensation patterns 23 are used to assist the conductive patterns 22 for reducing the influence of the edge notches on the visual effect, and are not electrically connected to the signal processing unit. In other words, from the viewpoint of the circuit design and layout, the optical compensation patterns 23 are floating.

To be noted, for the clear illustration, the relation (e.g. proportion) of the dimensions as shown in FIG. 2 is just for example, but not for showing the actual case. Besides, the conductive substrate 2 is instanced as having four conductive patterns 22 and three optical compensation patterns 23. However, the invention is not limited thereto. The numbers of the conductive patterns and the optical compensation patterns can be designed according to the actual requirements, such as the product specifications and the circuit design.

Figure 3A:
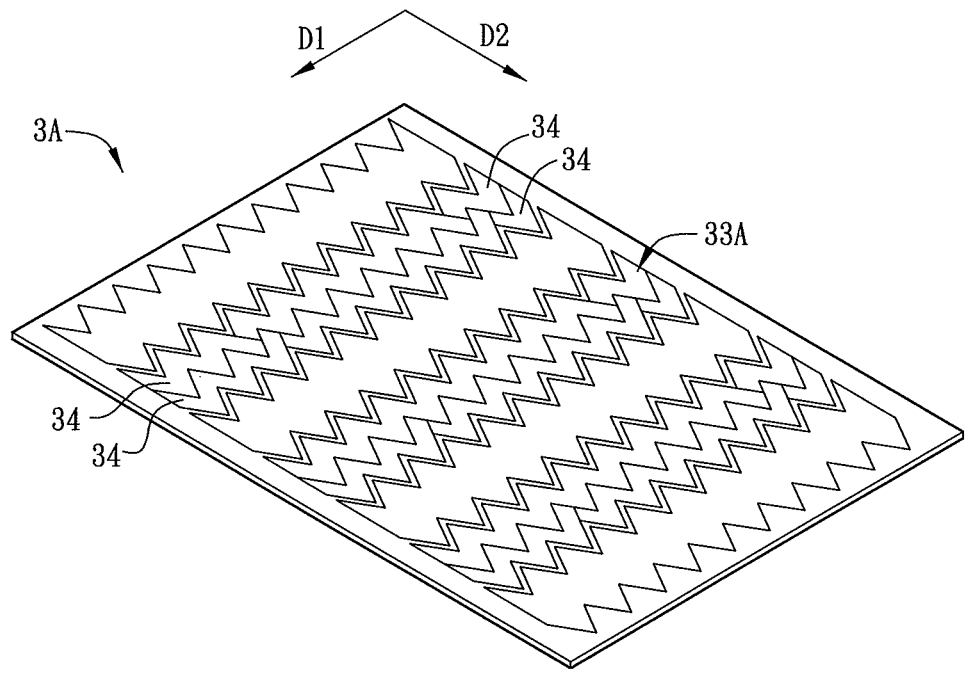
FIGS. 3A to 3G are schematic diagrams of variations of a conductive substrate according to an embodiment of the invention.

FIGS. 3A to 3G are schematic diagrams of variations of a conductive substrate according to an embodiment of the invention. In FIG. 3A, different from the conductive substrate 2, the optical compensation pattern 33A of the conductive substrate 3A has a plurality of optical sub-patterns 34, and the optical sub-patterns 34 can have the same or different forms or areas. Accordingly, in light of the product specifications or the process capability of the fixture, the optical compensation pattern can be made into a single pattern (as shown in FIG. 2) or a plurality of optical sub-patterns 34 (as shown in FIG. 3A).

Figure 3B:
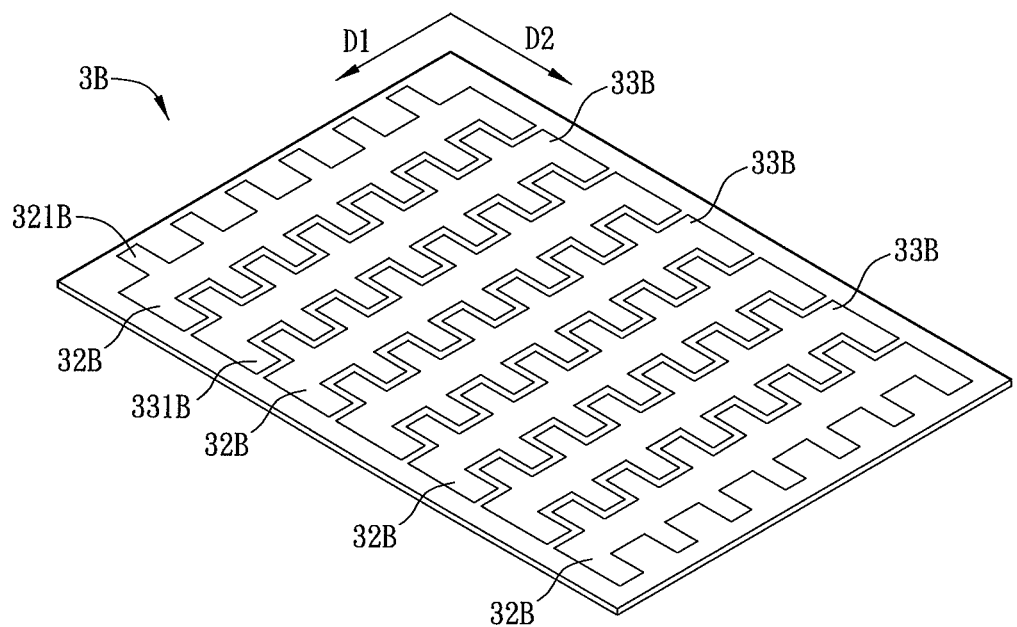
Figure 3C:
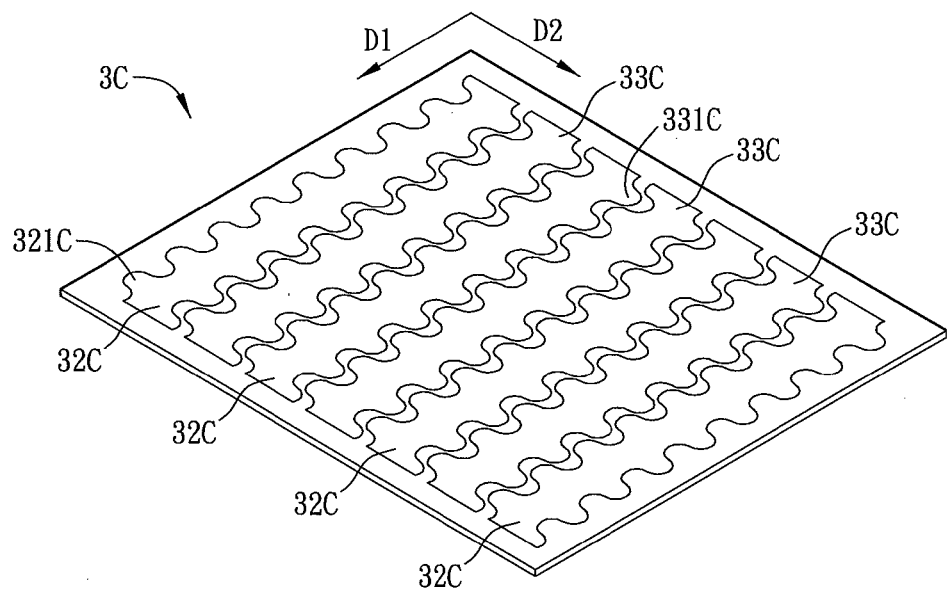
Figure 3D:
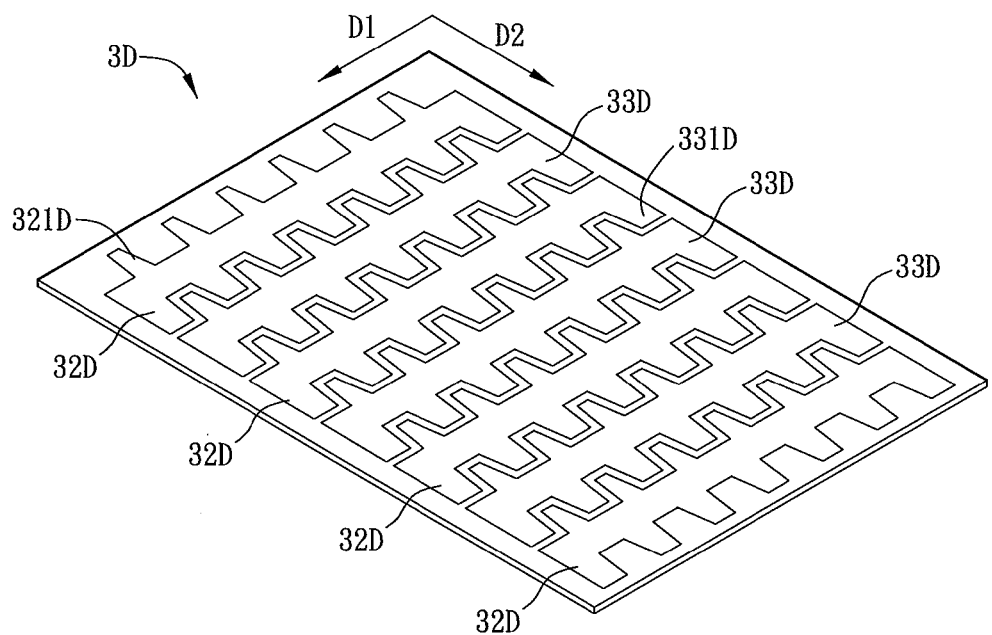
Figure 3E:
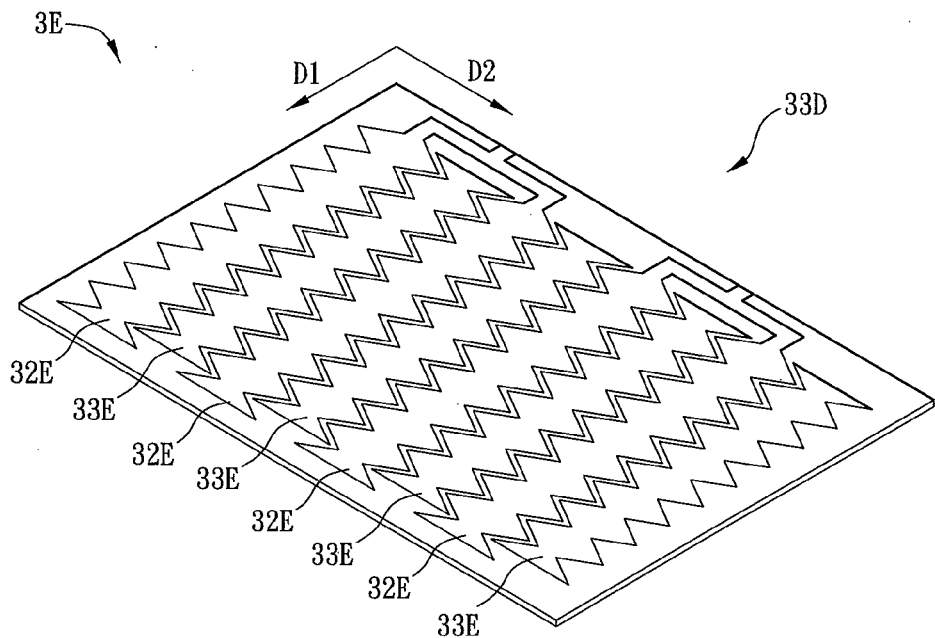
Figure 3F:
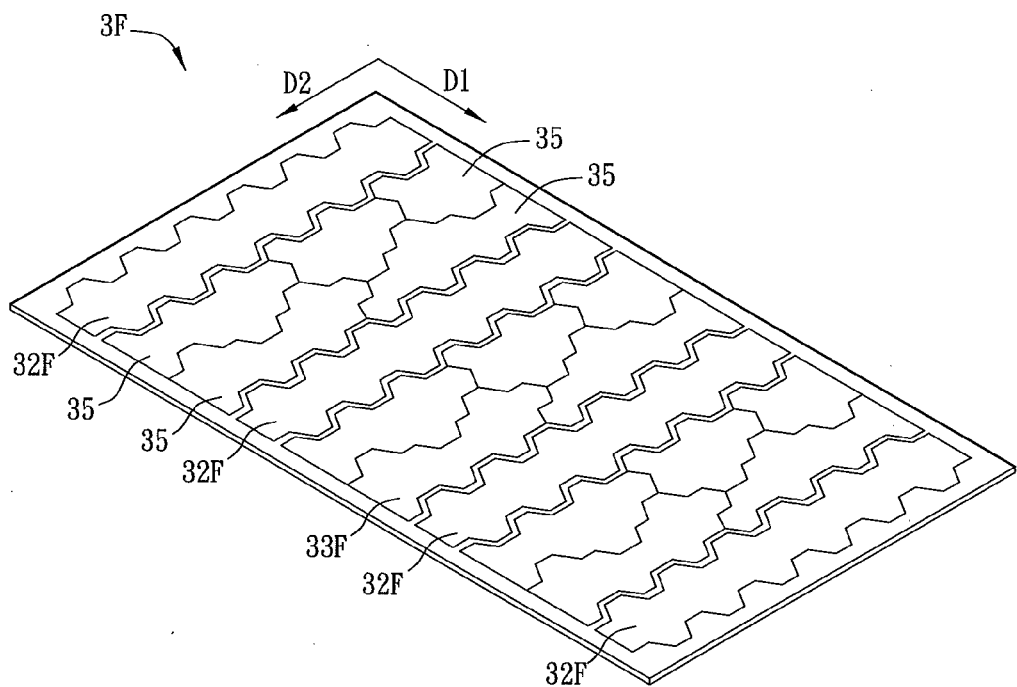
Figure 3G:
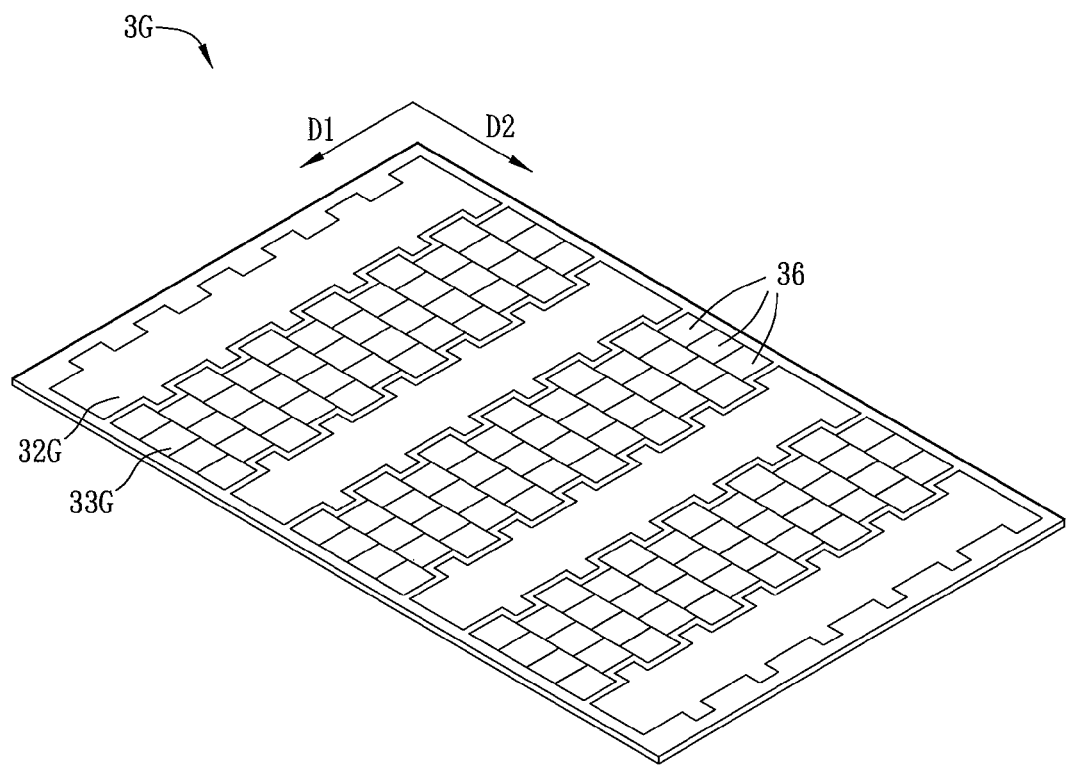

In FIG. 3B, the conductive protrusions 321B of the conductive pattern 32B and the optical compensation protrusions 331B of the optical compensation pattern 33B of the conductive substrate 3B each have a rectangular form. In FIG. 3C, the conductive protrusions 321C of the conductive pattern 32C and the optical compensation protrusions 331C of the optical compensation pattern 33C of the conductive substrate 3C each have a semicircular form. In FIG. 3D, the conductive protrusions 321D of the conductive pattern 32D and the optical compensation protrusions 331D of the optical compensation pattern 33D of the conductive substrate 3D each have a trapezoid form. Accordingly, no matter what kind of the forms are shown in FIGS. 3B to 3D, the conductive protrusions 321B to 321D and the optical compensation protrusions 331B to 331D can be regarded as staggered from each other in the way of convexes and concaves. In FIG. 3E, two adjacent conductive patterns 32E of the conductive substrate 3E are organized into a group, and such groups and the optical compensation patterns 33E are staggered from each other. In FIG. 3F, the conductive patterns 32F and the optical compensation patterns 33F of the conductive substrate 3F are staggered from each other, and the optical compensation patterns 33F are each composed of a plurality of optical sub-patterns 35. In FIG. 3G, the conductive patterns 32G and the optical compensation patterns 33G of the conductive substrate 3G are staggered from each other, and the optical compensation patterns 33G are each composed of a plurality of optical sub-patterns 36. Besides, the optical sub-patterns 36 of the optical compensation pattern 33G have the same area and appearance.

To be noted, for the clear illustration, the conductive patterns 32B to 32G in FIGS. 3A to 3G are shown in the way of a larger proportion.

Figure 4:
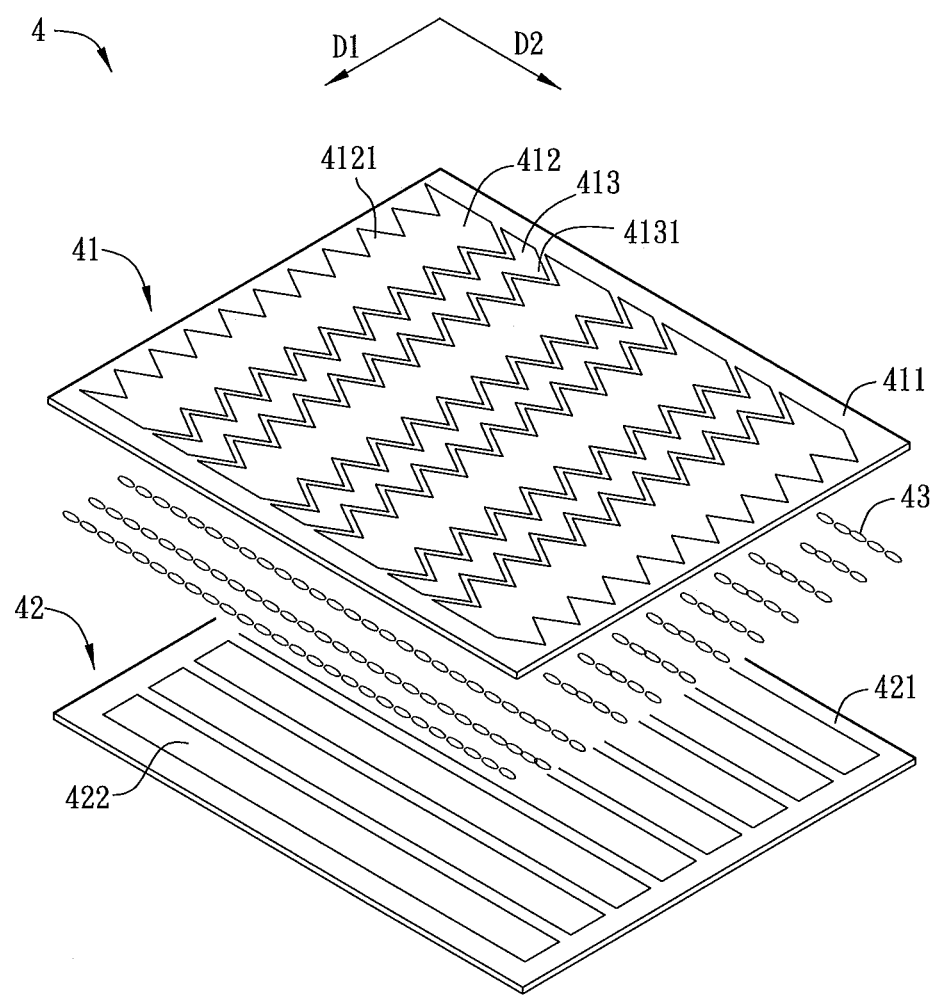
FIG. 4 is a schematic diagram of a touch display device according to an embodiment of the invention.

FIG. 4 is a schematic diagram of a touch display device 4 according to an embodiment of the invention. The touch display device 4 includes a first conductive substrate 41, a second conductive substrate 42, and a liquid crystal layer 43.

The first conductive substrate 41 includes a first substrate 411, a plurality of first conductive patterns 412, and a plurality of optical compensation patterns 413. As an embodiment, the first substrate 411 is a transparent substrate, such as a plastic substrate or a glass substrate. Otherwise, the first substrate 411 can be a transparent film-like substrate, made by polyimide (PI) or polyethylene terephthalate (PET) for example. In other words, the first substrate 411 can be a transparent inflexible substrate or a transparent flexible substrate.

The first conductive patterns 412 extend along a first direction D1, and are disposed sequentially and apart on the first substrate 411 along a second direction D2. Besides, the edge of the first conductive pattern 412 extending along the first direction D1 has a plurality of conductive protrusions 4121. In this embodiment, the first direction D1 is X-axis direction while the second direction D2 is Y-axis direction, for example. The first conductive patterns 412 are made by transparent material, such as indium tin oxide (ITO) or indium zinc oxide (IZO). Each of the first conductive patterns 412 has a width between 300 microns and 1000 microns.

The optical compensation patterns 413 are disposed on the first substrate 411 along the second direction D2, staggered from the first conductive patterns 412. Besides, the edge of each of the optical compensation patterns 413 extending along the first direction D1 has a plurality of optical compensation protrusions 4131. As an embodiment, the optical compensation pattern 413 and the conductive pattern 412 can have the same material, such as transparent ITO or IZO, and a width of each of the optical compensation patterns 413 is between 500 microns and 2000 microns. Moreover, the optical compensation pattern 413 and the conductive pattern 412 are spaced at an interval, which is between 1 micron and 10 microns for example and preferably between 1 micron and 5 microns.

In this embodiment, for the adjacent first conductive pattern 412 and optical compensation pattern 413, the conductive protrusions 4121 of the first conductive pattern 412 and the optical compensation protrusions 4131 of the optical compensation pattern 413 are staggered from each other, and that is, the top end of the conductive protrusion 4121 is corresponding to the bottom end of the adjacent optical compensation protrusion 4131 while the bottom end of the conductive protrusion 4121 is corresponding to the top end of the adjacent optical compensation protrusion 4131. Besides, the conductive protrusions 4121 and the optical compensation protrusions 4131 each have a triangular form, staggered from each other in the way of a zigzag.

The second conductive substrate 42 is disposed opposite to the first conductive substrate 41, and includes a second substrate 421 and a plurality of second conductive patterns 422. The second conductive patterns 422 extend along the second direction D2, and are disposed sequentially and apart on the second substrate 421 along the first direction D1. In other words, the extending directions of the first conductive patterns 412 and second conductive patterns 422 are perpendicular to each other. However, the invention is not limited thereto. In other embodiments, the angle between the extending directions of the first conductive patterns 412 and second conductive patterns 422 can be unequal to 90 degrees. The interlaced first conductive patterns 412 and second conductive patterns 422 can constitute capacitors for the touch sensing. The second substrate 421 is a transparent substrate, and made by ITO or IZO for example. As an embodiment, the second substrate 421 can be made by the material the same as or different from the first substrate 411. The first conducive patterns 412 and the second conductive patterns 422 of the touch display device 4 are used to function as transmitter electrodes or receiver electrodes.

The liquid crystal 43 is disposed between the first and second conductive substrates 41 and 42. The liquid crystal molecules of the liquid crystal layer 43 can be arranged horizontally or vertically, and here for example, they are arranged in the way of in plane switching (IPS). The first conductive pattern 412 is formed by patterning the shielding electrode of the display panel, and the second conductive pattern 422 is a part of the transmitter electrode. When the user touches the first conductive substrate 41 for conducting a touch input, the capacitance variation will be generated between the first and second conductive patterns 412 and 422, and then the coordinate signal can be obtained by the subsequent processing for achieving the touch control. When the user views and uses the touch display device 4 from a side of the first conductive substrate 41, the staggered disposition of the adjacent conductive protrusions 4121 and optical compensation protrusions 4131 can interfere with (such as destroying) the light passing through the first conductive patterns 412 and the optical compensation patterns 413, thereby reducing the refraction and scattering effects and also blurring the edges of the first conductive patterns 412 and optical compensation patterns 413, so as to lower down the influence of the edge notches on the visual effect and also reduce the interval between the first conductive patterns 412. Therefore, the whole visual effect is enhanced.

To be noted, the optical compensation patterns 413 are not electrically connected to a signal source or a signal processor. In other words, from the viewpoint of the circuit design and layout, the optical compensation patterns 413 are floating. That is, in contrast to the first conductive pattern 412, the optical compensation pattern 413 is a dummy electrode, having no concern with detecting, sensing, or transmitting the signal for the following processing.

In this embodiment, only the first conductive substrate 41 has the optical compensation patterns 413, and the first conductive pattern 412 and the optical compensation pattern 413 respectively include the conductive protrusion 4121 and the optical compensation protrusion 4131. However, in other embodiments, according to the actual requirements, the second conductive substrate 42 also can have optical compensation patterns, and the second conductive pattern 422 can include conducive protrusions. Besides, the conductive protrusion of the second conductive pattern 422 and the conductive protrusion 4121 of the first conductive pattern 412 can have the same or different appearance.

Besides, the first conductive pattern 412 and the optical compensation pattern 413 of the first conductive substrate 41 can be made in conformity with any embodiment in FIGS. 3A to 3G. In other words, the conductive protrusions 4121 and the optical compensation protrusions 4131 can each have a rectangular form, a semicircular form, or a trapezoid form, and can be staggered from each other in the way of convexes and concaves. The optical compensation pattern 413 also can be composed of a plurality of optical sub-patterns having the same or different area or appearance. The related technical features can be known by referring to the foregoing embodiments, and therefore they are not described here for concise purpose.

Figure 5A:
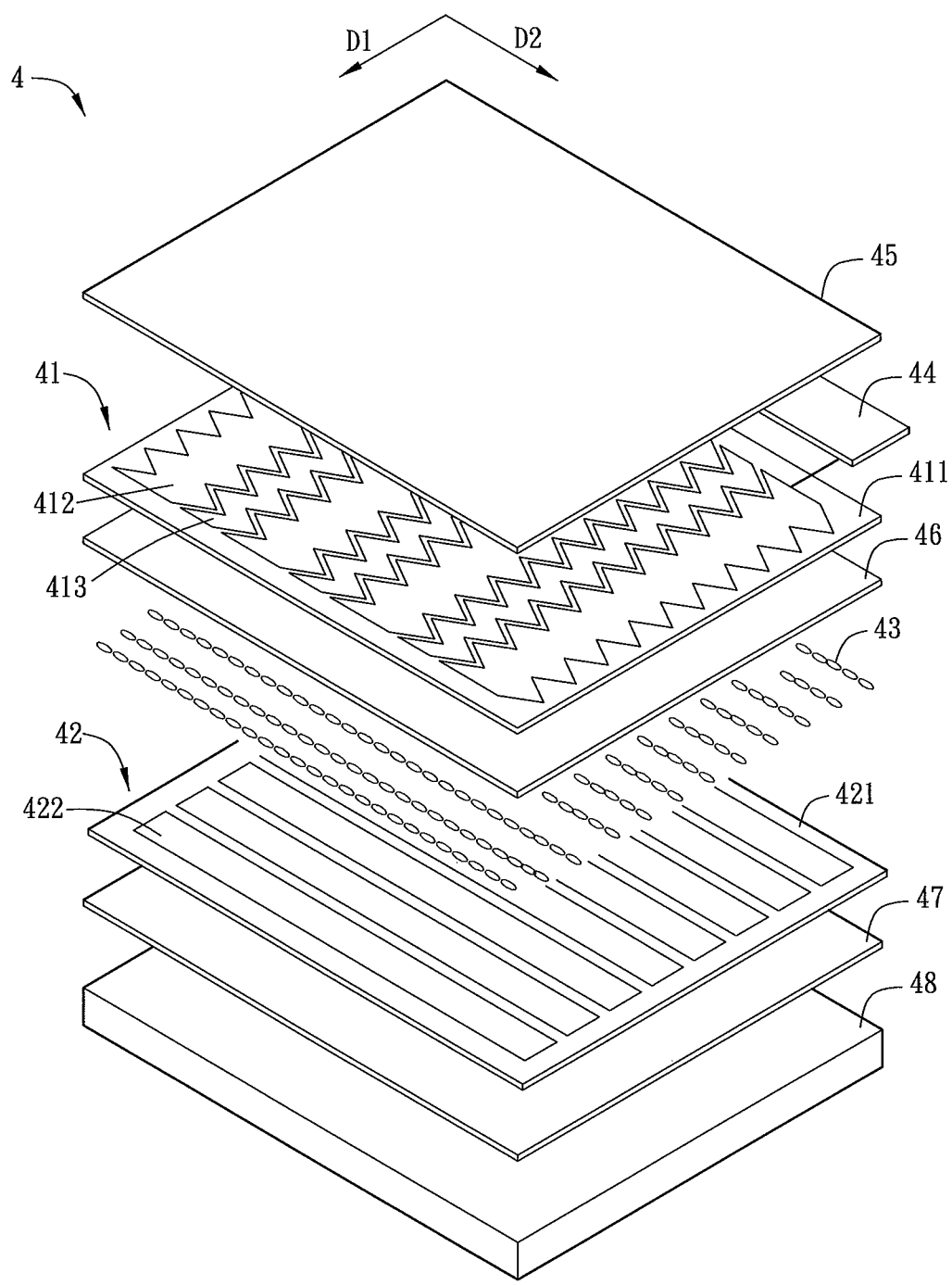
FIGS. 5A to 5C are schematic diagrams showing more details about the touch display device in FIG. 4.
Figure 5B:
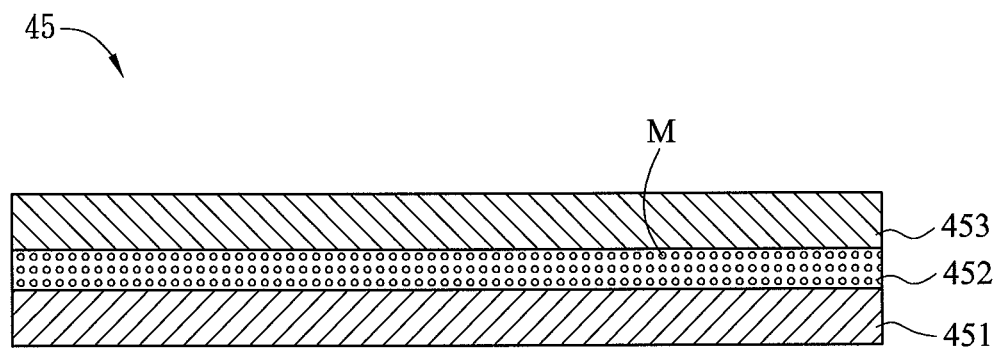
Figure 5C:
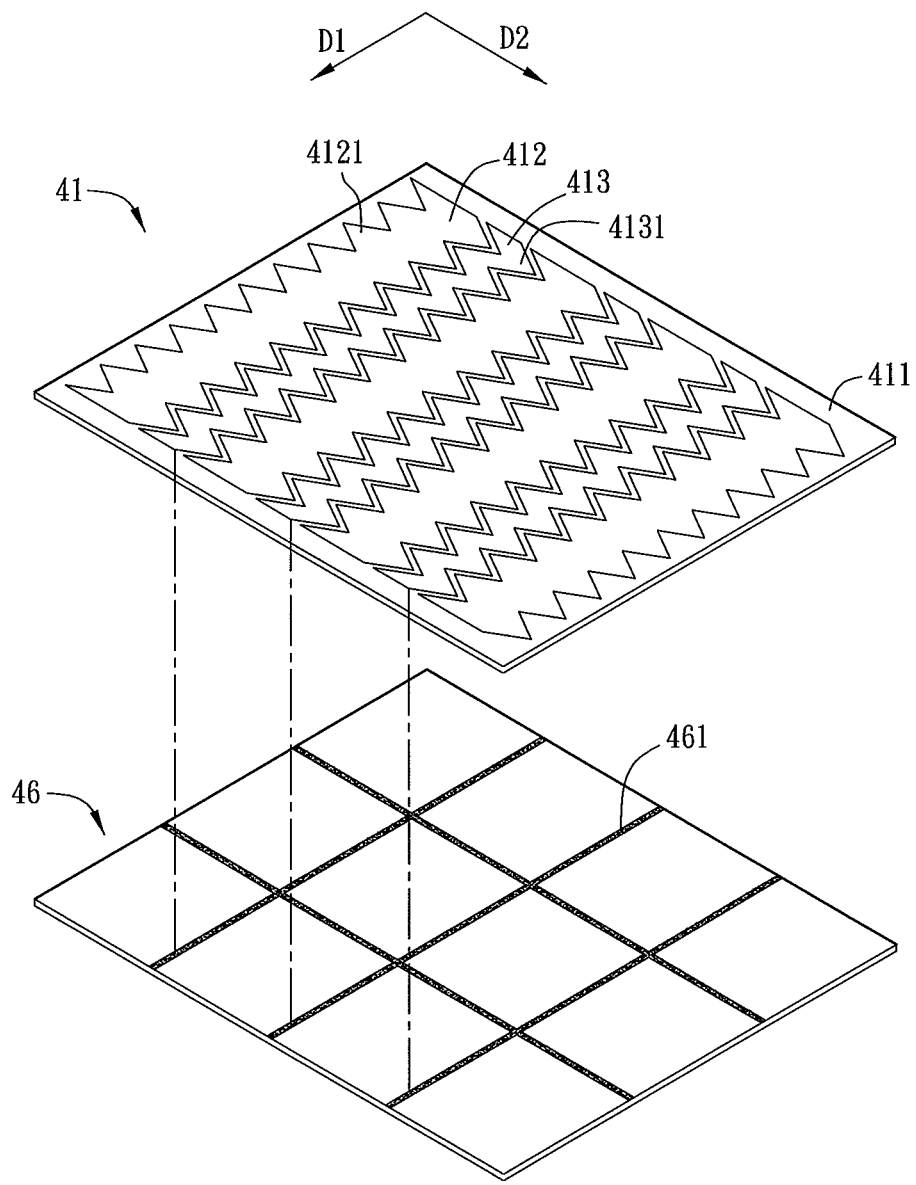

Subsequently, the touch display device 4 is further illustrated by referring to FIGS. 5A to 5C. As an embodiment, the touch display device 4 further includes a signal processing module 44, a first polarizing structure 45, a color filter layer 46, a second polarizing structure 47, and a backlight module 48.

The signal processing module 44 is electrically connected to the first conductive patterns 412 of the first conductive substrate 41 and the second conductive patterns 422 of the second conductive substrate 42. As an embodiment, the signal processing module 44 can have a plurality of signal processing units, programmable logic units and signal converting units, which are electrically connected to the first conductive patterns 412 or the second conductive patterns 422 for processing the signal detected, sensed or transmitted by the first conductive patterns 412 or the second conductive patterns 422. The signal processing module 44 is disposed on a printed circuit board (PCB) or a flexible printed circuit (FPC) board for example.

The first polarizing structure 45 is disposed on the first conductive substrate 41. In detail, the first polarizing structure 45 can include an adhesive film 451, a polarizing film 452 and a protective film 453. The adhesive film 451 is transparent and capable of adhesion, and can be attached to the first conductive substrate 41. The material of the adhesive film 451 is PSA for example. The polarizing film 452 is disposed on the adhesive film 451, and the protective film 453 is disposed on the polarizing film 452. The protective film 453 is transparent and can be made by the material resisting physical or chemical etching. For example, the protective film 453 can be a polyimide thin film, a polyethylene terephthalate (PET) thin film, or a flexible glass. At least one of the adhesive film 451, polarizing film 452 and protective film 453 is made by an anti-electrostatic material M. In FIG. 5B, for example, the polarizing film 452 is at least made by the anti-electrostatic material M. For the implementation, the anti-electrostatic material M can include metal micro-size particles or metal nanoparticles. By the first polarizing structure 45 having the anti-electrostatic material M disposed on the first conductive substrate 41, the light can be processed, and meanwhile, the electrostatic charge remaining on the optical compensation patterns 413 of the first conductive substrate 41 can be distributed and released through the first conductive patterns 412 and the grounding circuit of the signal processing module 44. Thereby, abnormal displayed images can be decreased and even prevented.

The color filter layer 46 is disposed between the first conductive substrate 41 and the liquid crystal layer 43, and has a blocking structure 461. As an embodiment, the blocking structure 461 can be at least composed of chromium, acrylic resin or TiO2. When the material of the blocking structure 461 includes acrylic resin, it further includes carbon or black dye. The vertical projection of the blocking structure 461 covers at least a part of the optical compensation patterns 413. For example, the pattern of the blocking structure 461 is based on the medians of the optical compensation patterns 413, and thus the vertical projection of the blocking structure 461 covers the portion of the optical compensation patterns excluding the optical compensation protrusions 4131. Here, the vertical projection is according to the stacking direction of the first conductive substrate 41, liquid crystal layer 43 and second conductive substrate 42.

The second polarizing structure 47 is disposed on a side of the second conductive substrate 42 away from the liquid crystal layer 43, and is preferably a polarizing film. The backlight module 48 is disposed on a side of the second polarizing structure 47 away from the second conductive substrate 42, and emits light that sequentially passes through the second polarizing structure 47, the second conductive substrate 42, the liquid crystal layer 43, the color filter layer 46 and the first conductive substrate 41 and is then outputted from the first polarizing structure 45.

Besides, a cover (not shown) can be disposed on the first polarizing structure 45 according to the requirements, for protecting the touch display device 4 so that the first polarizing structure 45 can be prevented from being rubbed or scraped and the moisture can be blocked from entering the touch display device 4. The cover is a glass plate for example.

In addition to the second polarizing structure 47, the touch display device 4 can further include a plurality of thin-film transistors (TFTs, not shown in the figure) disposed on a side of the second conductive substrate 42 facing the liquid crystal layer 43 so that the second conductive substrate 42 with the TFTs can become a TFT substrate.

Figure 6A:
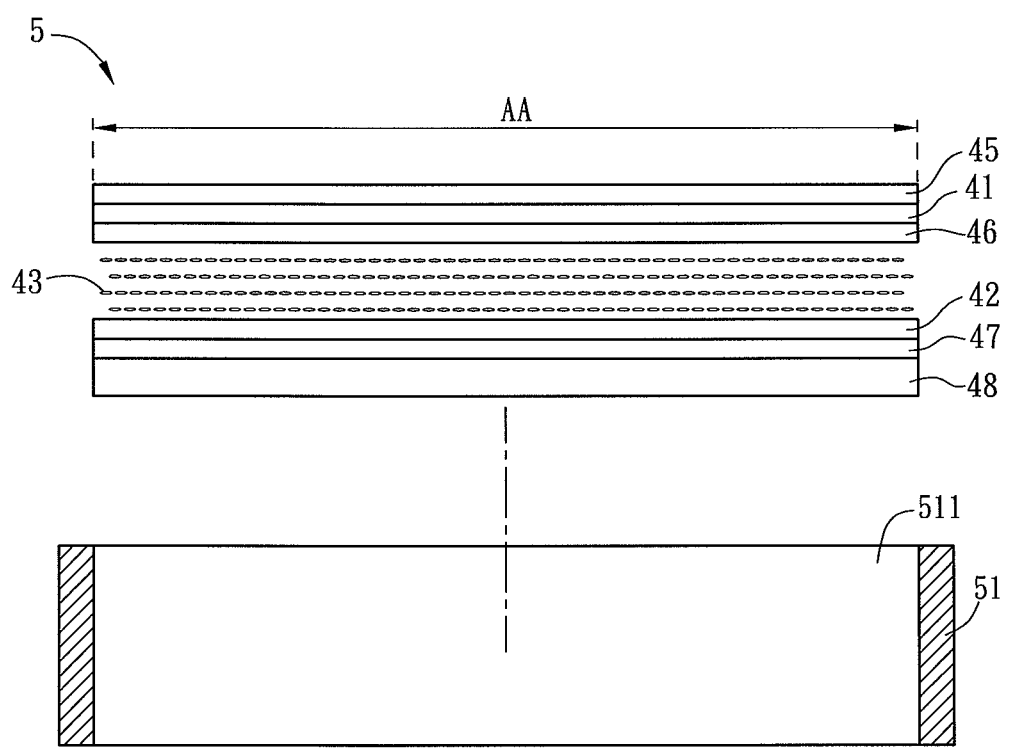
FIGS. 6A and 6B are schematic diagrams of a touch display device according to another embodiment of the invention.
Figure 6B:
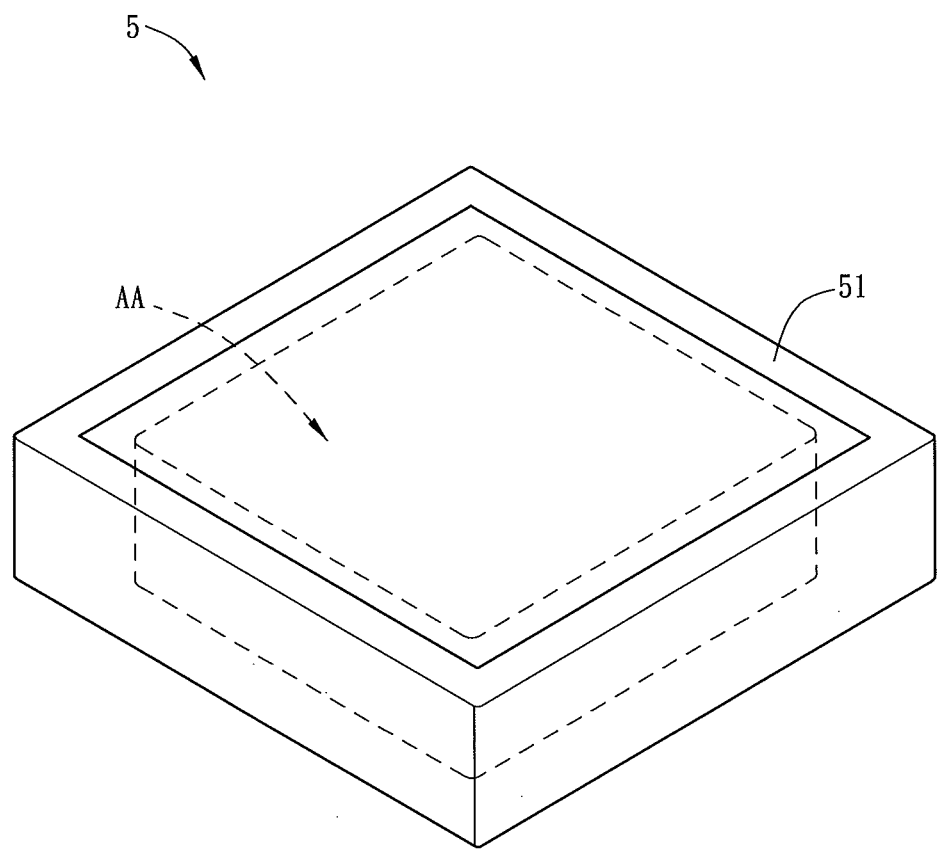

FIGS. 6A and 6B are schematic diagrams of a touch display device 5 according to another embodiment of the invention. Different from the touch display device 4, the touch display device 5 further includes a frame 51, which has an accommodating space 511 for accommodating the first conductive substrate 41, the second conductive substrate 42, the liquid crystal layer 43, the signal processing module 44, the first polarizing structure 45, the color filter layer 46, the second polarizing structure 47, and the backlight module 48. The frame 51 can be disposed to cover the peripheral circuits of the first and second conductive substrates 41 and 42, and therefore a touch area AA is defined. To deserve to be mentioned, the frame 51 can be made by conductive material (e.g. metal), and may contact the first polarizing structure 45, for further releasing the static electricity remaining on the optical compensation patterns 413.

Figure 7A:
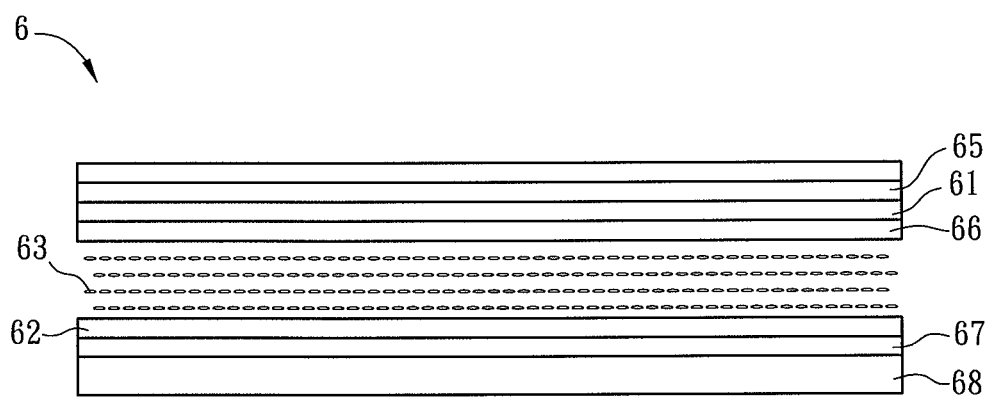
FIG. 7A is a schematic side view of a touch display device according to another embodiment of the invention.
Figure 7B:
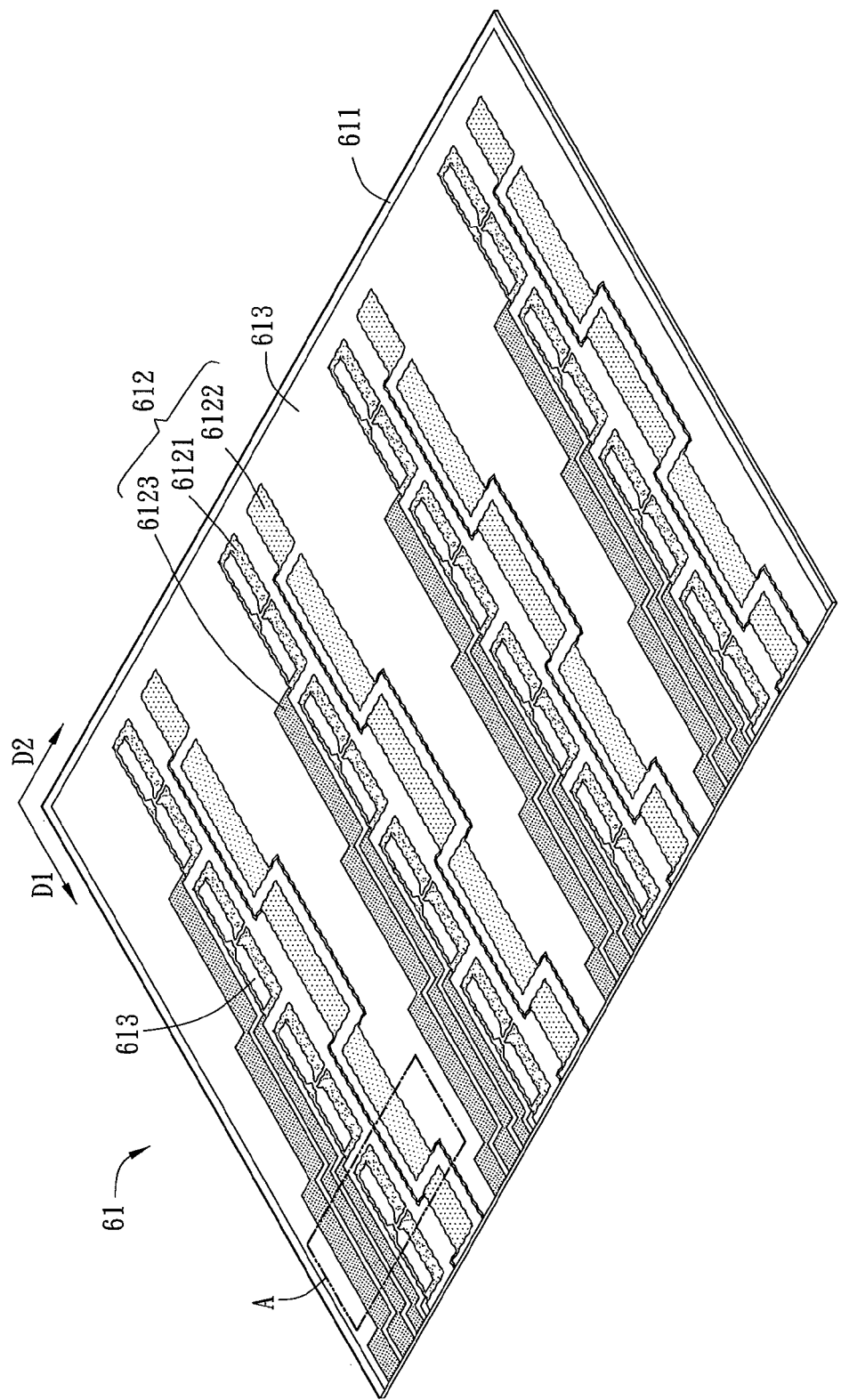
FIG. 7B is a schematic diagram of a conductive substrate in FIG. 7A.
Figure 7C:
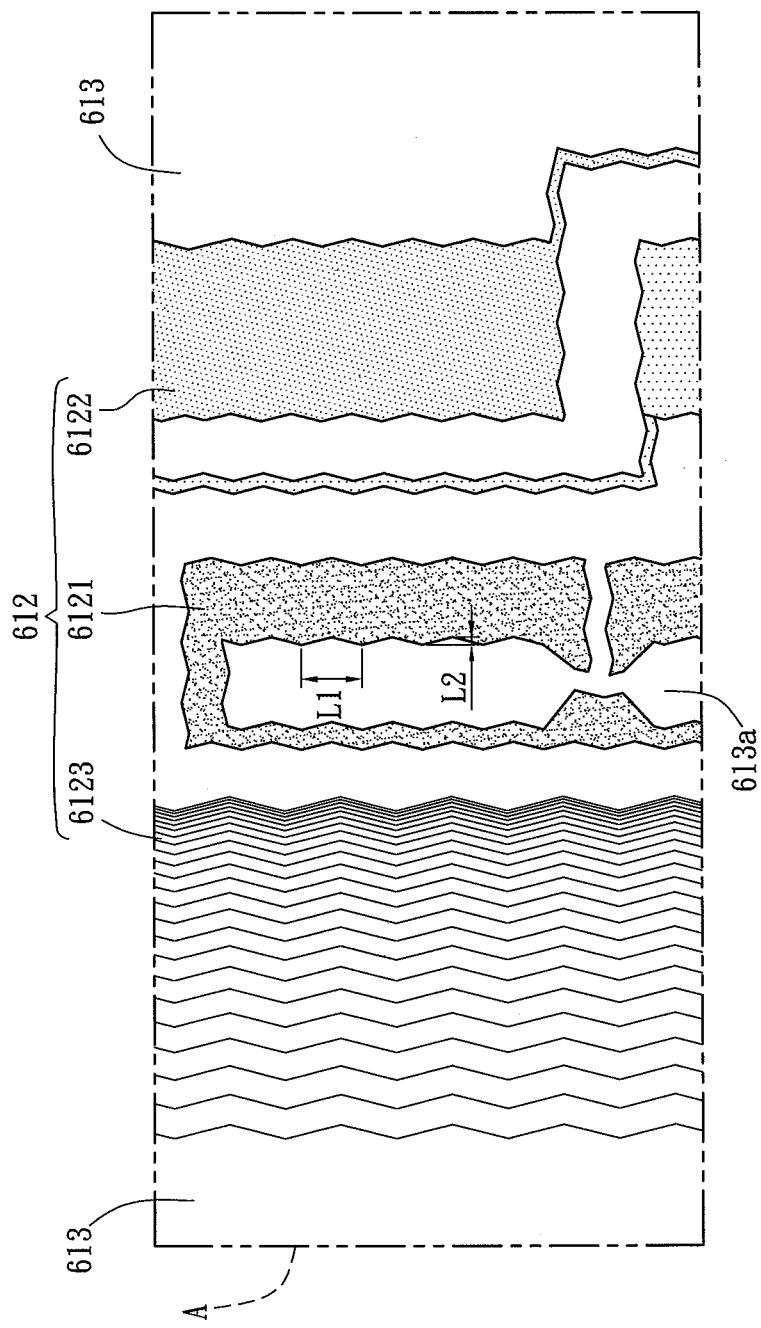
FIG. 7C is a schematic enlarged diagram of a rectangular area A bounded by a dashed line in FIG. 7B.

FIG. 7A is a schematic side view of a touch display device according to another embodiment of the invention, FIG. 7B is a schematic diagram of a conductive substrate in FIG. 7A, and FIG. 7C is a schematic enlarged diagram of a rectangular area A bounded by a dashed line in FIG. 7B. Besides, the rectangular area A occupies a width of a cycle on the conductive substrate.

As shown in FIGS. 7A to 7C, the touch display device 6 of this embodiment includes a first conductive substrate 61, a liquid crystal layer 63, a signal processing module (not shown), a first polarizing structure 65, a color filter layer 66, a second polarizing structure 67, a substrate 62 and a backlight module 68. To be noted, different from the above-mentioned touch display device 4, this embodiment only has a conductive substrate (first conductive substrate 61). The main components of the first conductive substrate 61 will be clearly illustrated in the following description.

The first conductive substrate 61 includes a first substrate 611, a plurality of conductive patterns 612 and a plurality of optical compensation patterns 613. Likewise, the conductive patterns 612 extend along a first direction D1 and are sequentially disposed on a surface of the first conductive substrate 61 along a second direction D2. The said surface of the first conductive substrate 61 can be the light output surface or light input surface of the first conductive substrate 61. The optical compensation patterns 613 and the conductive patterns 612 are staggered on the substrate 61 along the second direction D2. The conductive patterns 612 can further include transmitter electrodes 6121 and receiver electrodes 6122. The transmitter electrodes 6121 and the receiver electrodes 6122 are both formed into a single layer on the first substrate 611, and the optical compensation patterns 613 can be also formed into the same layer. Besides, the conductive patterns 612 and the optical compensation patterns 613 don't overlap each other. Similar to the above embodiment, the first direction D1 is such as X-axis direction while the second direction D2 is Y-axis direction.

Besides, an edge of each of the conductive patterns 612 and optical compensation patterns 613 extending along the first direction D1 has a plurality of conductive protrusions and optical compensation protrusions respectively, and thus has a jagged shape. Accordingly, the adjacent conductive protrusions and optical compensation protrusions are staggered.

As shown in FIGS. 7B and 7C, for a width of a cycle, the conductive pattern 612 further includes transmitter electrodes 6121, receiver electrodes 6122 and wire electrodes 6123. The transmitter electrodes 6121 and the receiver electrodes 6122 are disposed separately. Moreover, the transmitter electrodes 6121 and the receiver electrodes 6122 are electrically connected to the touch circuit (not shown) through the wire electrodes 6123. To be noted, for the wire electrodes 6123 in FIG. 7C, the solid lines denote the interval between the wire electrodes while the portion between the solid lines denotes the wire electrode. The touch circuit may be disposed near the first conductive substrate 61 for example. To be noted, the farther the transmitter electrode 6121 is from the signal processing unit, the greater width the wire electrode connecting the transmitter electrode 6121 and the signal processing unit has (denoting a larger area), and therefore the resistances between the signal processing unit and the transmitter electrodes 6121 at different locations can be kept closer to each other.

An edge of each of the transmitter electrode 6121, receiver electrode 6122 and wire electrode 6123 has a jagged shape. The distance L1 between the adjacent protruding points of the jagged shape can be between 10 microns and 1000 microns, and the minimum distance L2 between the adjacent protruding point and indented point can be between 10 microns and 1000 microns. However, to be noted, the jagged shape may be not a cyclic shape. The conductive protrusions of the transmitter electrode 6121, receiver electrode 6122 and wire electrode 6123 and the optical compensation protrusions of the optical compensation pattern 613 are staggered in the way of a complementary aspect.

To be noted, different from the optical compensation patterns of FIGS. 3A to 3G, the optical compensation patterns 613 of this embodiment are a grounding electrode. Moreover, in FIG. 7C, the optical compensation pattern 613a (a part of the optical compensation pattern 613) as the grounding electrode is surrounded by the transmitter electrode 6121, so that the transmitter electrode 6121 has a hollow shape, and the touch sensor performance can be adjusted thereby.

In this embodiment, the substrate A is a TFT substrate and is disposed opposite the first conductive substrate 61. The liquid crystal layer 63 is disposed between the first conductive substrate 61 and the substrate A.

In summary, in a conductive substrate and a touch display device according to the embodiments of the invention, an edge of each of the conductive patterns extending along a first direction has a plurality of conductive protrusions, an edge of each of the optical compensation patterns extending along the first direction has a plurality of optical compensation protrusions, and the conductive patterns and the optical compensation patterns are staggered from each other. Thereby, the edges of the conductive patterns can be effectively blurred, and thus the whole visual effect can be enhanced.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A touch display device, comprising:
   a first conductive substrate including a first substrate, a plurality of first conductive patterns and a plurality of optical compensation patterns, wherein the first conductive patterns extend along a first direction and are sequentially disposed on the first substrate along a second direction, the optical compensation patterns are staggered from the first conductive patterns along the second direction on the first substrate, an edge of at least one of the first conductive patterns extending along the first direction has a plurality of conductive protrusions, and an edge of at least one of the optical compensation patterns extending along the first direction has a plurality of optical compensation protrusions;
   a substrate disposed opposite the first conductive substrate;
   a liquid crystal layer disposed between the first conductive substrate and the substrate; and
   a color filter layer disposed between the first conductive substrate and the liquid crystal layer and having a blocking structure, a vertical projection of the blocking structure overlapping at least a part of the optical compensation patterns.

2. The touch display device as recited in claim 1, wherein the substrate is a second conductive substrate including a second substrate and a plurality of second conductive patterns which extend along the second direction and are sequentially disposed on the second substrate along the first direction.

3. The touch display device as recited in claim 2, further comprising:
   a signal processing module electrically connected to the first conductive patterns and the second conductive patterns;
   a first polarizing structure disposed on the first conductive substrate;
   a second polarizing structure disposed on a side of the second conductive substrate away from the liquid crystal layer; and
   a backlight module disposed on a side of the second polarizing structure away from the second conductive substrate.

4. The touch display device as recited in claim 3, wherein the first polarizing structure includes an anti-electrostatic material.

5. The touch display device as recited in claim 3, further comprising:
   a frame having an accommodating space for accommodating the first conductive substrate, the second conductive substrate, the liquid crystal layer, the signal processing module, the first polarizing structure, the color filter layer, the second polarizing structure, and the backlight module.

6. The touch display device as recited in claim 3, wherein the first polarizing structure further comprises:
   an adhesive film disposed on the first conductive substrate;
   a polarizing film disposed on the adhesive film; and
   a protective film disposed on the polarizing film.

7. The touch display device as recited in claim 1, wherein the first conductive patterns are a plurality of transmitter electrodes and a plurality of receiver electrodes, respectively.

8. The touch display device as recited in claim 7, wherein the optical compensation patterns are surrounded by the transmitter electrodes.

9. The touch display device as recited in claim 1, wherein the adjacent conductive protrusions and the optical compensation protrusions are staggered from each other.

10. The touch display device as recited in claim 1, wherein the adjacent conductive protrusions and the optical compensation protrusions are staggered from each other in the way of a zigzag or in the way of convexes and concaves.

11. The touch display device as recited in claim 1, wherein a width of at least one of the first conductive patterns is between 300 microns and 1000 microns, and a width of at least one of the optical compensation patterns is between 500 microns and 2000 microns.

12. The touch display device as recited in claim 1, wherein an interval formed between the adjacent first conductive pattern and optical compensation pattern is between 1 micron and 10 microns.

13. The touch display device as recited in claim 1, wherein the polarizing film includes an anti-electrostatic material.

14. The touch display device as recited in claim 1, wherein the optical compensation patterns and the first conductive patterns are in the same layer.

* * * * *